United States Patent
Leverrier et al.

(10) Patent No.: US 10,994,988 B2
(45) Date of Patent: May 4, 2021

(54) ELECTRONIC SYSTEM COMPRISING A MICROELECTROMECHANICAL SYSTEM AND A BOX ENCAPSULATING THIS MICROELECTROMECHANICAL SYSTEM

(71) Applicant: THALES, Courbevoie (FR)

(72) Inventors: Bertrand Leverrier, Valence (FR); Claude Sarno, Valence (FR); Claude Rougeot, Valence (FR); Romain Hodot, Valence (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 16/293,330

(22) Filed: Mar. 5, 2019

(65) Prior Publication Data

US 2019/0276307 A1  Sep. 12, 2019

(30) Foreign Application Priority Data

Mar. 7, 2018  (FR) ..................... 18 00197

(51) Int. Cl.
*B81B 7/02* (2006.01)
*B81B 7/00* (2006.01)

(52) U.S. Cl.
CPC .......... *B81B 7/0077* (2013.01); *B81B 7/0087* (2013.01); *B81B 7/02* (2013.01); *B81B 2201/0228* (2013.01); *B81B 2201/0235* (2013.01); *B81B 2201/0242* (2013.01); *B81B 2207/012* (2013.01); *B81B 2207/09* (2013.01); *B81B 2207/092* (2013.01); *B81B 2207/096* (2013.01)

(58) Field of Classification Search
None
See application file for complete search history.

(56) References Cited

U.S. PATENT DOCUMENTS

| | | | |
|---|---|---|---|
| 2003/0038415 A1 | 2/2003 | Anderson et al. | |
| 2010/0300201 A1 | 12/2010 | Ge et al. | |
| 2012/0049071 A1* | 3/2012 | Wong | G01J 5/045 250/343 |
| 2017/0275157 A1 | 9/2017 | Zhu et al. | |

FOREIGN PATENT DOCUMENTS

| | | |
|---|---|---|
| FR | 2 958 451 B1 | 10/2011 |
| FR | 2 966 813 A1 | 5/2012 |

OTHER PUBLICATIONS

Preliminary Search Report of related French Application No. FR 18 00197, dated Nov. 28, 2018.

* cited by examiner

*Primary Examiner* — Suberr L Chi
(74) *Attorney, Agent, or Firm* — Arent Fox LLP

(57) ABSTRACT

The present invention relates to an electronic system comprising an electronic system comprising an electromechanical microsystem and a hermetic box encapsulating said microsystem. The box includes a fastening plane. The electromechanical microsystem includes a sensitive part and at least two beams connecting the sensitive part to the fastening plane. The beams are thermally coupled to the sensitive part and are electrically coupled to one another. The system further includes a thermal regulator of the electromechanical microsystem including an electrical circuit including at least two ends connected to the beams, and a circuit controller able to generate an electrical current in the electrical circuit to modify the temperature of the sensitive part.

15 Claims, 3 Drawing Sheets

ELECTRONIC SYSTEM COMPRISING A MICROELECTROMECHANICAL SYSTEM AND A BOX ENCAPSULATING THIS MICROELECTROMECHANICAL SYSTEM

CROSS-REFERENCE TO RELATED APPLICATIONS

This application claims priority to French Patent Application No. 18 00197, filed Mar. 7, 2018. The disclosure of the prior application is hereby incorporated by reference in its entirety.

FIELD OF THE INVENTION

The present invention relates to an electronic system comprising an electromechanical microsystem and a hermetic box encapsulating said electromechanical microsystem.

BACKGROUND OF THE INVENTION

In a known manner, an electromechanical microsystem is a microsystem comprising one or several elements that use electricity as power source, in order to perform a sensor and/or actuator function with at least one structure having micrometric dimensions, and the function of which is partially performed by the form of said structure. The term electromechanical microsystem is shortened using the acronym MEMS.

To see to the proper operation of a resonant electromechanical microsystem, the latter is generally mounted in a hermetic box under vacuum, for example made from a ceramic material. This box includes electrical contacts necessary to implement the transmission of data and optionally electricity between the electromechanical microsystem and an outside system.

Such a box is in particular described in document FR 2,958,451.

Furthermore, to provide the stable attachment of the electromechanical microsystem in the box while preserving the performance of the microsystem, it is known from document FR 2,966,813 to use flexible beams, also called decoupling arms, connecting the microsystem to the box. These decoupling arms, given their flexible nature, make it possible to absorb the differential expansions between the MEMS system and the box.

An electromechanical microsystem may for example have an actuator or a sensor, in particular an inertial sensor or an oscillator.

It is known that such an electromechanical microsystem has, during operation, a high sensitivity to outside temperature variations. Thus, it is often necessary to provide thermal control of the electromechanical microsystem in order to guarantee the homogeneity of the precision of its measurements or its actions. This is particularly the case when the electromechanical microsystem is used in so-called sensitive applications that may in particular be found in the aeronautic or aerospace field.

Traditionally, to implement thermal control of an electromechanical microsystem, the state of the art proposes the use of a Peltier model near a sensitive part of said microsystem. This module makes it possible either to heat or cool the sensitive part or the entire MEMS system. Another solution consists of adding a resistive element that, by Joule effect, makes it possible to heat the sensitive part or the entire MEMS system.

However, these solutions are not fully satisfactory.

In particular, in some cases, in light of constraints imposed in particular by the box, these solutions are implemented too far away from the MEMS system, such that a strong power is necessary to provide the proper operation of the assembly. In other cases, when these solutions are applied directly to the MEMS system, it is necessary for the operation of the assembly to add heterogeneous materials in this system. This generates carryover and differential expansion constraints, which deteriorates the long-term stability performance of the electromechanical microsystems. Furthermore, this adds additional steps during the production of these systems.

SUMMARY OF THE INVENTION

The present invention aims to propose an electronic system with thermal regulation for a MEMS system that is particularly compact and that does not require adding additional materials, in particular on this MEMS system.

The invention thus makes it possible to provide effective and precise thermal regulation of the MEMS system without deteriorating the performance thereof.

To that end, the invention relates to an electronic system comprising an electromechanical microsystem and a hermetic box under vacuum encapsulating said electromechanical microsystem. The box includes a fastening plane.

The electromechanical microsystem includes a sensitive part and at least two beams connecting the sensitive part to the fastening plane, each beam being made from an at least partially conductive material.

The beams are thermally coupled to the sensitive part and are electrically coupled to one another. The system further includes a thermal regulator of the electromechanical microsystem including an electrical circuit including at least two ends connected to the beams, and a circuit controller able to generate an electrical current in the electrical circuit to modify the temperature of the sensitive part.

According to other advantageous aspects of the invention, the system comprises one or more of the following features, considered alone or according to all technically possible combinations:

- the thermal regulator further includes an elementary sensor able to measure at least one parameter of the sensitive part varying as a function of the temperature thereof; the circuit controller being able to generate an electrical current in the electrical circuit as a function of the measurements supplied by the elementary sensor;
- each beam is connected to the fastening plane via a fastening element integrated into said plane at a point of contact; each end of the electrical circuit being electrically connected to one of the points of contact;
- the fastening plane forms the inner surface of a face of the box;
- the fastening plane is attached to each face of the box and thermally insulated from the latter;
- the fastening plane is open-worked;
- the thermal regulator further includes a Peltier module thermally coupled to the sensitive part;
- each beam and/or the sensitive part are/is made from a silicon-based material;
- an insulating layer arranged between the sensitive part and the beams;
- an intermediate layer in which the sensitive part is etched and a lower layer forming the beams;

the intermediate layer and the lower layer being electrically insulated and thermally coupled, via the insulating layer;

the lower layer further includes a central substrate in contact with the insulating layer and electrically coupling the beams;

each beam is a decoupling arm that is deformable in flexion; and the system forms a sensor, preferably an inertial sensor.

BRIEF DESCRIPTION OF THE DRAWINGS

These features and advantages of the invention will appear upon reading the following description, provided solely as a non-limiting example, and done in reference to the appended drawings, in which.

DETAILED DESCRIPTION OF THE INVENTION

Figure 1:
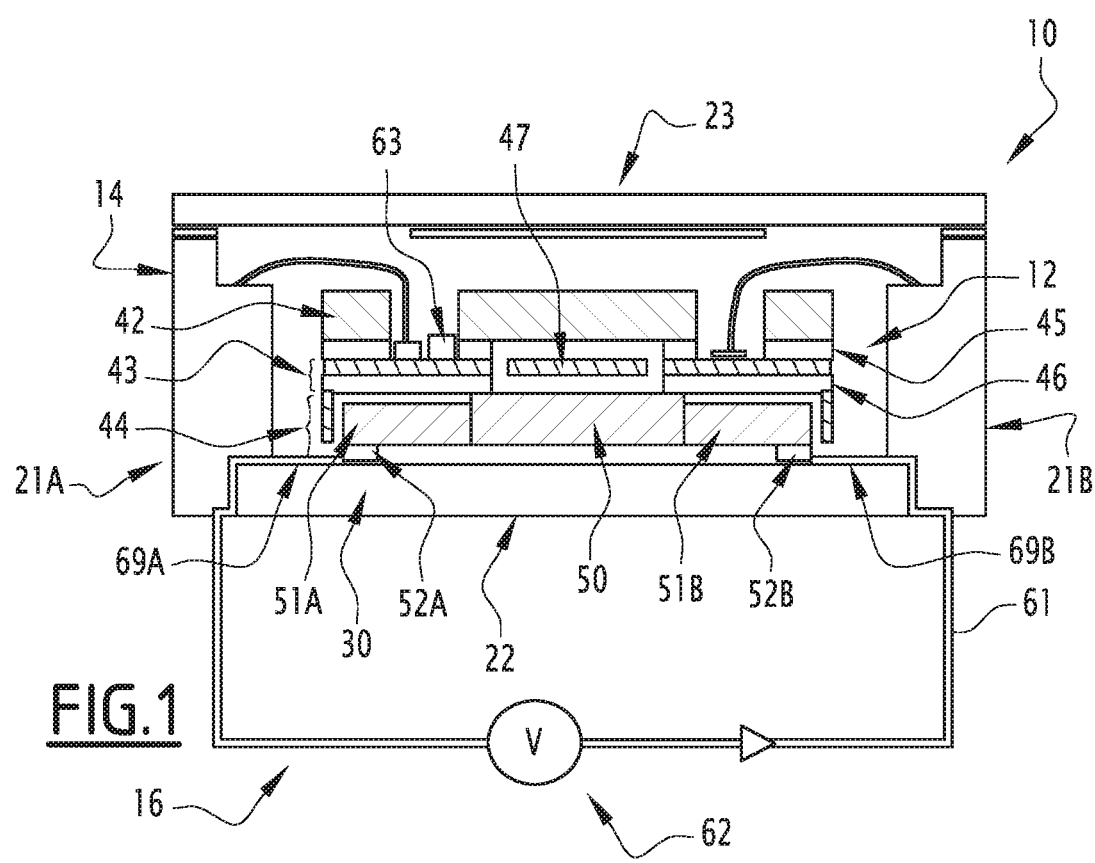
FIG. 1 is a sectional view of an electronic system according to a first embodiment of the invention, the electronic system in particular including a box.

The electronic system 10 of FIG. 1 is for example a sensor, preferably an inertial sensor. It is for example usable on board an aircraft to measure its angular speed and/or its acceleration.

According to another example embodiment, the electronic system 10 is a clock with silicon resonator.

According to other example embodiments, the electronic system according to the invention corresponds to any other electronic system requiring thermal control, such as an oscillator or a high-precision actuator.

In reference to FIG. 1, the electronic system 10 comprises an electromechanical microsystem 12, a hermetic box 14 under vacuum encapsulating said electromechanical microsystem 12 and a thermal regulator 16 in particular of the electromechanical microsystem 12.

The box 14 is for example made in several layers of ceramic and for example assumes a parallelepiped shape made up of four side walls 21A to 21D (also shown in FIG. 2), a box bottom 22 and a lid 23.

In a manner known in itself, the side walls 21A to 21D comprise output electrical contacts 25 in particular connecting the electromechanical microsystem 12 to outside systems and allowing the transmission of signals, in particular analog signals, between these different systems.

The lid 23 is also known in itself and in particular makes it possible to close the box 14 hermetically under vacuum, when the electromechanical microsystem 12 is mounted therein.

The box bottom 22 comprises a ceramic base 30 forming an outer face arranged in contact with the outside middle of the box 14 and an inner face.

According to the first embodiment of the invention, the box bottom 22 further comprises a metallized layer 31 partially covering the inner face of the ceramic base 30.

Figure 2:
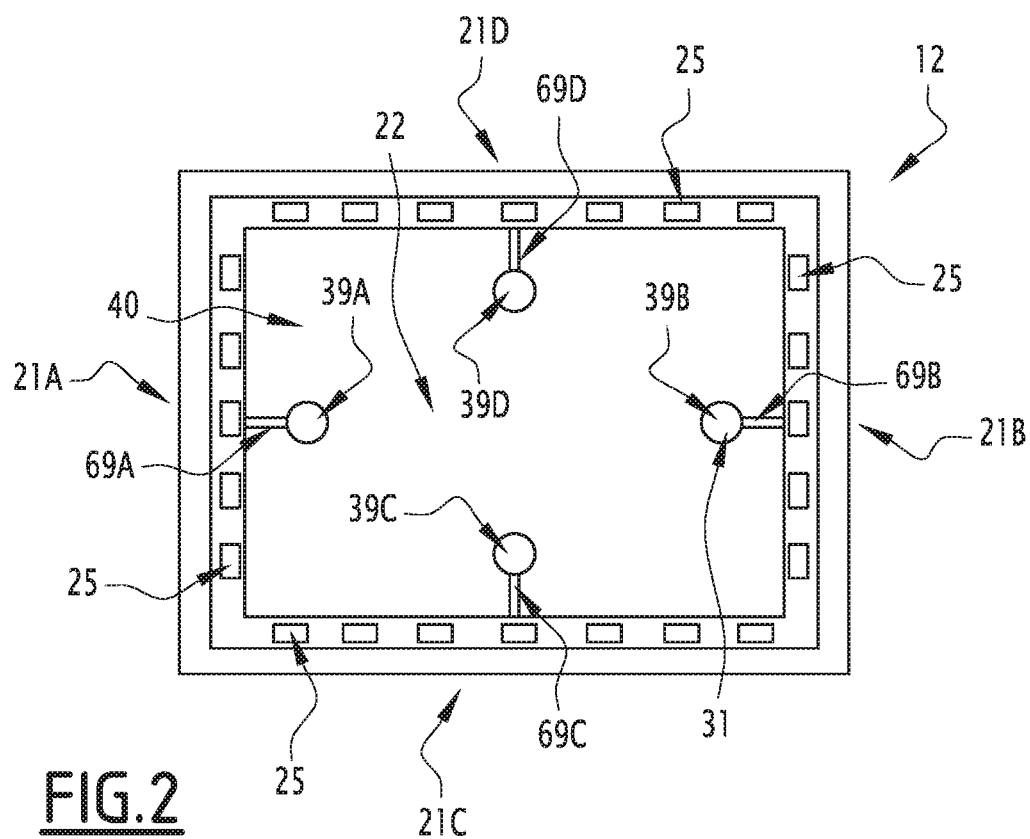
FIG. 2 is a top view of the box of FIG. 1.

In particular, the metallized layer 31 defines a plurality of fastening points designated by general references 39A to 39D in FIG. 2.

The fastening points 39A to 39D are for example arranged symmetrically relative to an axis perpendicular to the box bottom 22. The number of these fastening points 39A to 39D corresponds to the number of fastening points explained in detail hereinafter.

Furthermore, in the metallized layer 31, the fastening points 39A to 39D are electrically insulated from one another. This is for example done by breaking the continuity of the metallized layer 31 to insulate the zones comprising these fastening points 39A to 39D.

The metallized layer 31 with the fastening points 39A to 39D form a fastening plane 40.

In general, the box 14 is for example according to one of the examples described in document FR 2,958,451.

The electromechanical microsystem 12, also known as "MEMS" or "MEMS system", makes it possible to carry out the operation of the electronic system 10.

In particular, in reference to FIG. 1, the electromechanical microsystem 12 is made up of three electrically conductive layers, namely an upper layer 42, an intermediate layer 43 and a lower layer 44, and two electrically insulating layers 45, 46 arranged between these conductive layers 42 to 44.

Each conductive layer 42 to 44 is made from an at least partially conductive material, for example a material strongly doped with silicon.

Each insulating layer 45, 45 makes it possible to electrically insulate the conductive layers 42 to 44 from one another and is for example made from a silicon oxide.

The intermediate layer 43 in particular defines a sensitive part 47 for example etched at the center of said layer 43. The sensitive part 47 in particular acts as a gyroscope and/or an accelerometer and makes it possible respectively to measure the angular speed or the acceleration of the electronic system 10, along one or several axes. According to another example embodiment, the sensitive part 47 acts as a resonator.

The intermediate layer 43 is connected to the electrical contacts of the box 14 by connecting means able to receive and/or send signals, in particular analog signals, from outside systems and/or to said systems.

The precision of the measurements supplied by the intermediate layer 43 for example depends on the temperature of the medium in contact with said layer.

The upper layer 42 is optional and in particular has a cover making it possible to protect the sensitive part 47 from dust during the mounting of the electromechanical microsystem 12 in the box 14.

The lower layer 44 includes a central substrate 50 in contact with the insulating layer 46 and supporting said layer 46 as well as the layers 42, 43, 45 and a plurality of beams arranged for example around the central substrate 50.

Each beam advantageously has a decoupling arm.

The decoupling arms make it possible to fasten the electromechanical microsystem 12 to the fastening plane 40 flexibly via a defined fastening element for each of said arms. Each decoupling arm is deformable in flexion and thus makes it possible to decouple the movements of the electromechanical microsystem 12 from the box 14.

In the example embodiment of FIGS. 1 and 2, the lower layer 44 includes four decoupling arms and therefore four fastening elements associated with said decoupling arms. Only two decoupling arms designated by general references 51A, 51B, and two fastening elements designated by general references 52A, 52B, are visible in FIG. 1.

The decoupling arms are for example arranged symmetrically relative to an axis perpendicular to the fastening plane 40 and for example extend in the directions defined by the side walls 21A to 21D of the box 14, without having interception points between them.

The fastening elements are also made from an at least partially conductive material and are fastened to the fastening plane 40 on the fastening points 39A to 39D, for example by brazes or conductive glue.

In general, the decoupling arms can be implemented according to any one of the examples mentioned in document FR 2,966,813.

According to one example embodiment, the central substrate 50 enables electrical coupling of all of the fastening arms.

According to another example embodiment, the central substrate 50 allows electrical coupling together of each pair of decoupling arms by forming a plurality of connected pairs. Thus, the decoupling arms belonging to different connected pairs are electrically insulated from one another.

Furthermore, the central substrate 50 is electrically insulated from the intermediate layer 43 via the insulating layer 46 while remaining thermally coupled to said intermediate layer 43.

In the example embodiment of FIG. 1, the thermal regulator 16 includes an electrical circuit 61, a circuit controller 62, and advantageously, an elementary sensor 63.

The elementary sensor 63 is able to measure at least one parameter of the sensitive part 47 varying as a function of the temperature thereof. This parameter may for example be the temperature directly or then any other physical parameter such as the expansion or compression of said part or of the intermediate layer 43 in general, along one or several axes.

The circuit controller 62 is connected to the elementary sensor 63 and is able to generate an electrical current in the electrical circuit 61 as a function of said parameter in order to modify, in particular to increase, the temperature of the sensitive part 47.

The circuit controller 62 for example assumes the form of a programmable electronic controller connected to a power source (for example, a battery) and defining a positive terminal and a negative terminal. This controller 62 is programmed for example so as to provide a voltage difference across its terminals with a value determined as a function of the parameter provided by the elementary sensor 63 or a voltage difference of predetermined value.

The circuit controller 62 is for example arranged outside the box 14.

The electrical circuit 61 is connected to the terminals of the controller 62 and further defines one end 69A to 69D for each fastening point 39A to 39D. In other words, the electrical circuit 61 allows the electrical connection of each fastening point 39A to 39D to the positive or negative terminal of the circuit controller 62.

Advantageously, when the decoupling arms form several electrically insulated connected pairs, the electrical circuit 61 allows the electrical connection of the fastening point corresponding to the decoupling arm of one of the pairs to the positive terminal and the fastening point corresponding to the other decoupling arm of the same pair to the negative terminal.

In the described example, the fastening points 39A, 39D are connected to the positive terminal of the circuit controller 62 and the fastening points 39D, 39C are connected to the negative terminal of the circuit controller 62.

Outside the box 14, the electrical circuit 61 for example assumes the form of a plurality of electrical cables insulated from one another.

Inside the box 14 and optionally inside its walls, the electrical circuit 61 for example assumes the form of a plurality of electrical cables or a plurality of tracks formed in the metallized layer 31 similarly to the fastening points 39A to 39D.

In the example of FIG. 2, the ends 69A to 69D are in the form of tracks formed in the metallized layer 31, leading toward the corresponding fastening points 39A to 39D.

The operation of the electrical system 10 according to the first embodiment will now be explained.

Initially, the temperature of the intermediate layer 43, and in particular of the sensitive part 47, is for example below a nominal operating temperature.

This temperature is measured by the elementary sensor 63, which next sends the corresponding data to the circuit controller 62.

The latter analyzes the received data and creates, across its terminals, a voltage difference of predetermined value as a function of the received data or a voltage difference of predetermined value.

This then generates a current in the electrical circuit 61.

The generated current passes through the decoupling arms and, in light of their resistance, heats them. This then heats the central substrate 50, which transmits the heat to the intermediate layer 43 and in particular the sensitive part 47, in light of the thermal coupling between these different components.

When, by analyzing the data provided by the elementary sensor 63, the circuit controller 62 considers that the nominal operating temperature has been reached, it cuts the power of the electrical circuit 61.

Figure 3:
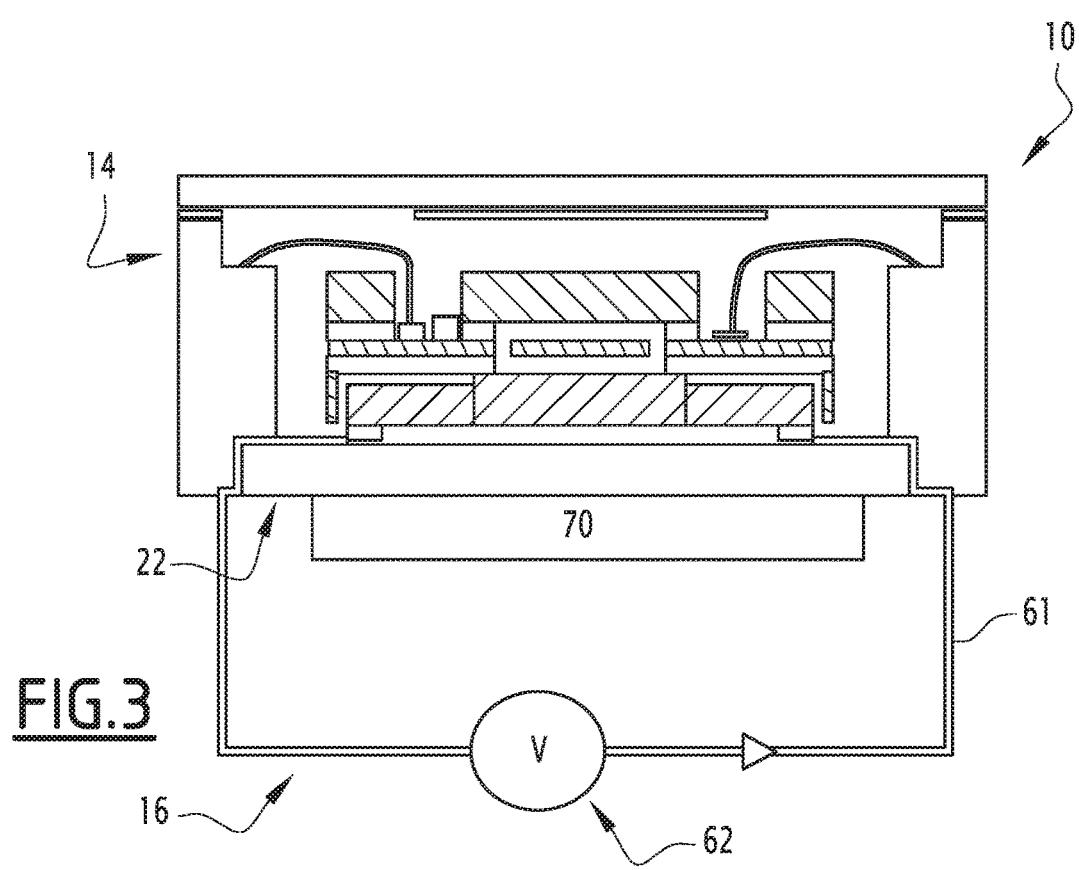
FIG. 3 is a sectional view of the electronic system of FIG. 1 according to one advantageous aspect of the invention.

According to the advantageous aspect of the invention illustrated in FIG. 3, the thermal regulator 16 further includes a Peltier module 70 known in itself.

This Peltier module 70 is for example arranged in contact with the outer face of the ceramic base 30 of the box 14. According to another example embodiment, this module 70 is arranged inside the box 14.

The operation of the Peltier module 70 is for example controlled by the controller 62.

Thus, based on data supplied by the elementary sensor 63, the controller 62 can for example activate the operation of the module 70 in order to cool the box bottom 22 and therefore the electromechanical microsystem 12.

One can then see that the invention has a certain number of advantages.

First, the invention avoids any addition of additional components inside the box, and in particular the addition of additional materials on the electromechanical microsystem. Thus, according to the invention, no additional constraint is added on the electromechanical microsystem, which extends its lifetime and makes it possible to keep the box relatively compact. Furthermore, no additional production step is necessary during the mounting of the electromechanical microsystem in the box.

Furthermore, the invention makes it possible to apply the heating directly on the electromechanical microsystem and even on the sensitive part thereof. Given that the electromechanical microsystem is packaged under vacuum, this decreases heat losses and therefore limits the necessary power.

Lastly, the proposed solution can easily be combined with the use of a Peltier module in particular to be able to cool the electromechanical microsystem.

Figure 4:
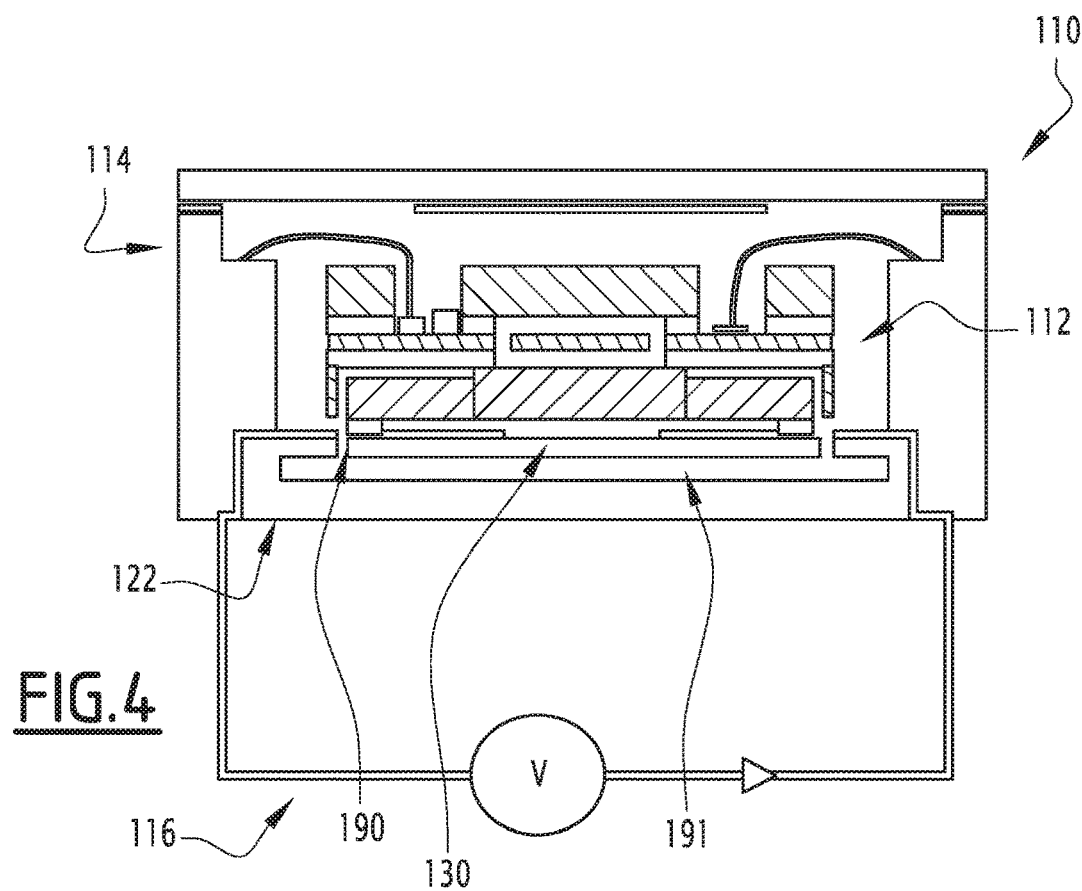
FIG. 4 is a sectional view of an electronic system according to a second embodiment of the invention, the electronic system in particular including a box.
Figure 5:
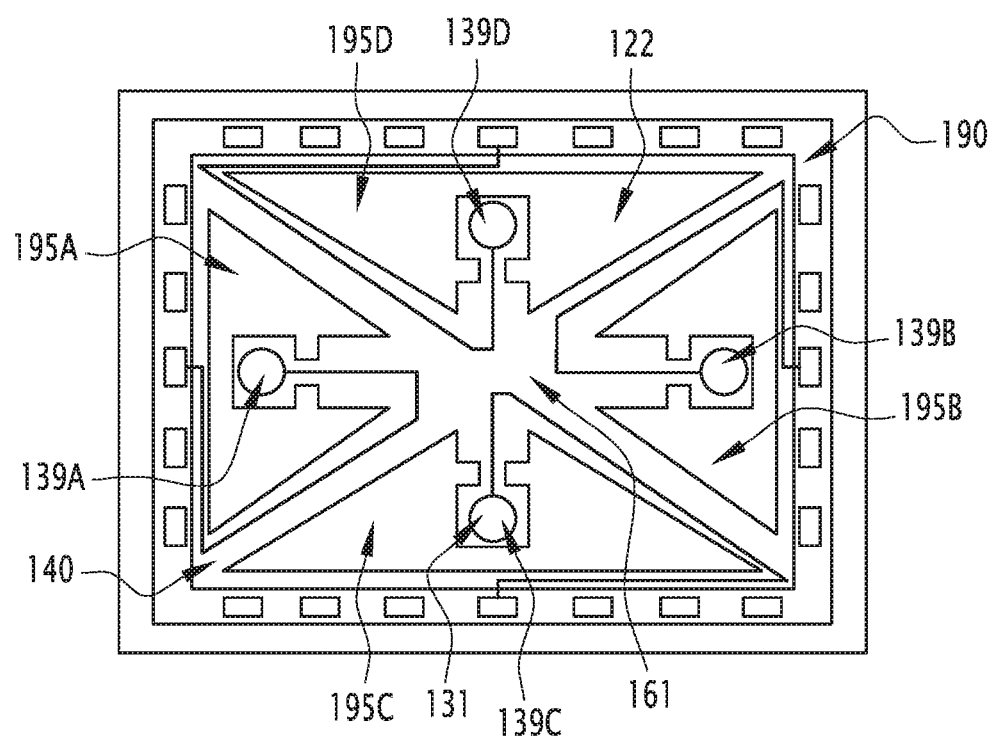
FIG. 5 is a top view of the box of FIG. 4.

An electronic system 110 according to a second embodiment is illustrated schematically in FIGS. 4 and 5.

This electronic system 110 is similar to the electronic system 10 previously described and in particular includes an electromechanical microsystem 112 and a thermal regulator 116 that are substantially identical respectively to the electromechanical microsystem 12 and the thermal regulator 16 previously described. These components therefore will not be described in reference to the second embodiment.

The electronic system 110 further includes a box 114 that differs from the box 14 previously described by its box bottom 122 and in that it further includes a platform 190 attached to the box bottom 122, thus forming a vacuum layer 191.

Indeed, according to the second embodiment, the box bottom 122 is for example homogeneous and is made substantially entirely from a same material or a plurality of layers of a same material, for example ceramic.

The platform 190 conversely comprises a base 130, for example made from ceramic, and a metallized layer 131 partially covering the base 130. The metallized layer 131 is similar to the layer 31 previously described. In particular, the metallized layer 131 defines fastening points 139A to 139D similar to the fastening points 39A to 39D.

The platform 190 therefore forms a fastening plane 140 attached to the box bottom 22. The fastening role of this plane 140 remains similar to that of the plane 40.

Furthermore, the platform 190 is fastened for example on the side walls of the box 114 by using suitable fastening arms.

According to the advantageous aspect of the second embodiment visible in detail in FIG. 5, the platform 190 is open-worked and for example forms four openings 195A to 195D.

These openings 195A to 195D are for example triangular such that the base 130 of the platform 190 assumes the form of a rectangular frame passed through by two through-hole components along each diagonal of the rectangle.

In this case, the parts of an electrical circuit 161 of the thermal regulator 116 that are found inside the box 114 assume a shape suitable for arriving at the fastening points 139A to 139D.

In particular, in the example of FIG. 5, these parts assume the form of tracks formed in the metallized layer 131 that first follow the frame, and then half of one of the diagonal through-hole components forming the platform 190.

According to this embodiment, a Peltier module can also be integrated into the system, for example inside the box 14.

The operation of the system 110 according to this embodiment is similar to the operation of the system 10 previously described.

The particular advantage of the second embodiment of the invention consists of the presence of a vacuum layer between the sensitive part and the box bottom. This then provides increased thermal insulation of the sensitive element and decreases the performance necessary for heating thereof.

Furthermore, the particular shape of the ceramic base makes it possible to decrease the thermal conduction of the decoupling arms and thus to further improve the thermal insulation of the sensitive part.

Of course, other embodiments are also possible.

Furthermore, it is clear that in the embodiments as a whole, the thermal regularization of the electromechanical microsystem is done primarily owing to the beams, the Peltier module or any other heating element being optional.

The invention claimed is:

1. An electronic system comprising an electromechanical microsystem and a hermetic box under vacuum encapsulating said electromechanical microsystem;
   the hermetic box including a fastening plane;
   the electromechanical microsystem including:
   a sensitive part; and
   at least two beams connecting the sensitive part to the fastening plane, each beam of the at least two beams being made from an at least partially conductive material;
   wherein each beam of the at least two beams are thermally coupled to the sensitive part and are electrically coupled to one another; and
   wherein the system further includes a thermal regulator of the electromechanical microsystem including an electrical circuit including at least two ends connected to each beam of the at least two beams, and a circuit controller able to generate an electrical current in the electrical circuit to modify a temperature of the sensitive part.

2. The system according to claim 1, wherein the thermal regulator further includes an elementary sensor able to measure at least one parameter of the sensitive part varying as a function of the temperature thereof;
   the circuit controller being able to generate an electrical current in the electrical circuit as a function of the measurements supplied by the elementary sensor.

3. The system according to claim 1, wherein each beam of the at least two beams is connected to the fastening plane via a fastening element integrated into said plane at a point of contact;
   each end of the electrical circuit being electrically connected to one of the points of contact.

4. The system according to claim 1, wherein the fastening plane forms an inner surface of a face of the hermetic box.

5. The system according to claim 1, wherein the fastening plane is attached to each face of the hermetic box and thermally insulated from the latter.

6. The system according to claim 5, wherein the fastening plane is open-worked.

7. The system according to claim 1, wherein the thermal regulator further includes a Peltier module thermally coupled to the sensitive part.

8. The system according to claim 1, wherein each beam of the at least two beams and/or the sensitive part are/is made from a silicon-based material.

9. The system according to claim 1, further including an insulating layer arranged between the sensitive part and each beam of the at least two beams.

10. The system according to claim 9, including an intermediate layer in which the sensitive part is etched and a lower layer forming each beam of the at least two beams;
    the intermediate layer and the lower layer being electrically insulated and thermally coupled, via the insulating layer.

11. The system according to claim 10, wherein the lower layer further includes a central substrate in contact with the insulating layer and electrically coupling each beam of the at least two beams.

12. The system according to claim 1, wherein each beam of the at least two beams is a decoupling arm that is deformable in flexion.

13. The system according to claim 1, forming a sensor.

14. The system according to claim 13, wherein said sensor is an inertial sensor.

15. The system according to claim 1, wherein each beam of the at least two beams is able to emit heat when an electric current is generated in the electrical circuit.

\* \* \* \* \*